(12) United States Patent
Mathe et al.

(10) Patent No.: US 6,300,826 B1
(45) Date of Patent: Oct. 9, 2001

(54) APPARATUS AND METHOD FOR EFFICIENTLY AMPLIFYING WIDEBAND ENVELOPE SIGNALS

(76) Inventors: Lennart Mathe, 6755 Mira Mesa Blvd., #123-260, San Diego, CA (US) 92121; Don Kimball, 12880 Orangeburg Ave., San Diego, CA (US) 92129; Joe Archambault, 10540 Mathieson, San Diego, CA (US) 92129; Walter Haley, 2110 Dogwood Pl., Escondido, CA (US) 92026

( * ) Notice: Subject to any disclaimer, the term of this patent is extended or adjusted under 35 U.S.C. 154(b) by 0 days.

(21) Appl. No.: 09/566,194

(22) Filed: May 5, 2000

(51) Int. Cl.[7] .............................. H03F 3/38; H03F 3/68
(52) U.S. Cl. .............................. 330/10; 330/126
(58) Field of Search ........................ 330/10, 126, 207 A, 330/136, 251, 149

(56) References Cited

U.S. PATENT DOCUMENTS

| | | | |
|---|---|---|---|
| 5,973,556 | * 10/1999 | Su | 330/207 A |
| 6,084,468 | * 7/2000 | Sigmon et al. | 330/251 |
| 6,137,358 | * 10/2000 | Midya et al. | 330/149 |
| 6,175,273 | * 1/2001 | Sigmon et al. | 330/136 |

FOREIGN PATENT DOCUMENTS

2262705 * 10/1990 (JP) ........................................ 330/10

OTHER PUBLICATIONS

Lohrmann "Amplifier has 85% Efficiency" Electronic Design; vol. 14, Mar. 1, 1966, pp. 38–43.*

* cited by examiner

Primary Examiner—Michael B Shingleton
(74) Attorney, Agent, or Firm—Lyon & Lyon LLP

(57) ABSTRACT

Systems and methods for amplifying an RF input signal include employing a moderately power efficient wide bandwidth device, such as an AB-type amplifier, to amplify the power residing in the high frequency components of the input signal, and a highly power efficient narrow bandwidth device, such as a synchronous buck DC/DC converter, to amplify the power residing in the low frequency components of the input signal. The amplified low frequency components and high frequency components are then combined to produce an amplified replica of the RF input signal. A positive feedback loop is provided between the output of the AB-type amplifier and the input of the DC/DC converter to provide stability to the amplified RF signal. A negative feedback loop is provided between the output of the DC/DC converter and the input of the AB-type amplifier to minimize interference introduced by the DC/DC converter.

24 Claims, 5 Drawing Sheets

APPARATUS AND METHOD FOR EFFICIENTLY AMPLIFYING WIDEBAND ENVELOPE SIGNALS

FIELD OF THE INVENTION

The present invention relates generally to amplifiers, and more particularly to high frequency wide bandwidth amplifiers.

BACKGROUND

In the wireless communications industry, a premium is placed on the ability to amplify wide bandwidth signals, e.g., spread spectrum signals, in a highly efficient manner. As an example, a typical eighteen-channel base station requires approximately 540 watts of RF power output (30 watts per each channel). Assuming a typical power amplifier efficiency of 5 percent, the amount of power needed to generate an RF power output of 540 watts will be 10.8 kW, with 10.26 kW being dissipated as heat. This dissipated heat represents a drawback in that it not only requires the use of fans and heat sinks to cool the base station, but also translates to wasted energy, thereby reducing battery life. In short, the cost of the base station increases as the efficiency of the power amplifiers used in the base station decreases.

Although various attempts have been made to address this problem, it remains difficult to design a high efficiency power amplifier that is able to linearly amplify wide bandwidth signals. This is due to the paradoxical nature of a typical amplifier, which exhibits a wide bandwidth capability that is inversely proportional to its efficiency. The amplification of spread spectrum signals, such as code division multiple access (CDMA) signals, which typically have high peak-to-average signal amplitude ratios, make it difficult, if not impossible, to continuously operate the power amplifier in saturation, thereby reducing the efficiency of a power amplifier even further.

A method that has been proposed to solve this problem involves the use of envelope elimination and restoration (EER), which is a technique through which highly efficient radio frequency (RF) power amplifiers can be combined to produce a high efficiency linear amplifier system. In this method, a modulated input signal is split into two paths: an amplitude path through which the envelope of the modulated input signal is processed, and a phase path through which the phase modulated carrier of the modulated input signal is processed. The envelope of the modulated input signal is amplified through a highly efficient amplifier, which operates at the narrower modulated bandwidth, i.e., the bandwidth of the envelope, thereby producing an amplified envelope signal. A high frequency, highly efficient amplifier is then used to modulate the high frequency phase modulated carrier with the amplified envelope signal, thereby generating an amplified replica of the modulated input signal. Specifically, the amplifier that generates the amplified envelope signal acts as the DC power supply to the high frequency amplifier. The efficiency of this EER amplifier system can be calculated by multiplying the efficiencies of the two amplifiers. For example, if the efficiency of each of the amplifiers is 50%, the total efficiency of the EER amplifier system will be 25%.

Although the use of an EER amplifier system to amplify wide bandwidth modulated signals is, in general, beneficial, its efficiency and maximum modulation bandwidth is dependent upon the efficiency and bandwidth of the power supply amplifier.

Accordingly, it would be desirable to provide apparatus and methods for increasing the efficiency and bandwidth of an amplifier for a variety of purposes, which may include the provision of DC power to an RF power amplifier within an EER amplifier system.

SUMMARY OF THE INVENTION

The present invention is directed to systems and methods for efficiently amplifying relatively wide bandwidth signals.

In accordance with a first aspect of the present inventions, a method can be employed to amplify an input signal (e.g., an envelope signal obtained from a CDMA signal), which exhibits one or more lower frequency components and one or more higher frequency components. It should be understood that "lower" and "higher" are relative terms, and are only meant to define a frequency component with respect to another frequency component. It should also be understood that a lower frequency component may encompass a DC component. The method includes generating a first signal by amplifying the input signal, sensing the first signal (e.g., the current), and generating a second signal by amplifying the power residing in the one or more lower frequency components of the first signal. The power residing in the one or more lower frequency components of the first signal is inversely varied with the second signal. In effect, amplification of the power residing in the one or more lower frequency components of the input signal is minimized during the first stated amplification, and maximized during the second stated amplification. The first and second signals are then combined to produce an amplified input signal. The positive feedback provided from the sensed first signal to the amplification of the second signal provides stability to the amplified input signal. Optionally, the second signal can be sensed (e.g., the voltage) and the input signal inversely varied with the sensed second signal, e.g., to minimize noise otherwise created during the second stated amplification.

The bandwidth of the input signal may be relatively wide, e.g., between 0 MHz and 10 MHz. In such a case, the one or more lower frequency components will make up a relatively narrow range within the bandwidth, e.g., between 0 MHz and 1 MHz, and the one or more higher frequency components will make up a relatively higher range within the bandwidth, e.g., between 1 MHz and 10 MHz. In such a case, amplification of the one or more high frequency components is preferably accomplished at a first power efficiency, and amplification of the one or more low frequency components is preferably accomplished at a second higher power efficiency. As a result, the power within the narrower low frequency range is efficiently amplified, and the power within the wider high frequency range is amplified substantially free of distortion.

In accordance with a second aspect of the present inventions, an amplifier circuit is provided for amplifying an input signal, e.g., an envelope signal extracted from a CDMA signal. The amplifier circuit includes an AB-type amplifier, which is configured to receive the input signal, and a synchronous buck DC/DC converter, the input of which is coupled to the output of the amplifier through a positive feedback loop. A resistive load is coupled in parallel between the respective outputs of the AB-type amplifier and the DC/DC converter. In the preferred embodiment, the positive feedback loop includes a current sensor coupled to the output of the AB-type amplifier, and a pulse width modulator coupled between the current sensor and the input of the DC/DC converter. The sensed current is driven to a relatively low value due to the feedback process, such that mostly the higher frequency components remain in the sensed current. Optionally, a negative feedback loop can be coupled between the output of the DC/DC converter and the input of the AB-type amplifier. The negative feedback loop may include a differential operational amplifier having an output coupled to the input of the AB-type amplifier, an inverting input coupled to the output of the converter, and a noninverting input for receiving the input signal.

In accordance with a third aspect of the present inventions, an amplifier circuit is provided for amplifying an input signal. The amplifier circuit comprises a dependent voltage source, e.g., an AB-type RF amplifier, that operates at a first bandwidth and a first power efficiency, and a dependent current source, e.g., a synchronous buck DC/DC converter, that operates at a second bandwidth narrower than the first bandwidth and a second power efficiency greater than the first power efficiency. The dependent voltage source is configured to generate a first voltage that varies with the input signal, and the dependent current source is configured to generate a second current that varies with a first current produced by the dependent voltage source. A load is coupled in parallel between the dependent voltage source and the dependent current source, wherein the first voltage appears across the load, and the first and second current flow through the load.

Optionally, the dependent voltage source is configured, such that the first voltage inversely varies with a second noise voltage generated by the current source. In the preferred embodiment, the first bandwidth encompasses the second bandwidth, with the second bandwidth being at the lower end of the first bandwidth. For example, the first bandwidth can range from 0 MHz to 10 MHz, with the second bandwidth ranging from 0 MHz to 1 MHz.

Other objects and features of the present invention will become apparent from consideration of the following description, taken in conjunction with the accompanying drawings.

BRIEF DESCRIPTION OF THE DRAWING

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
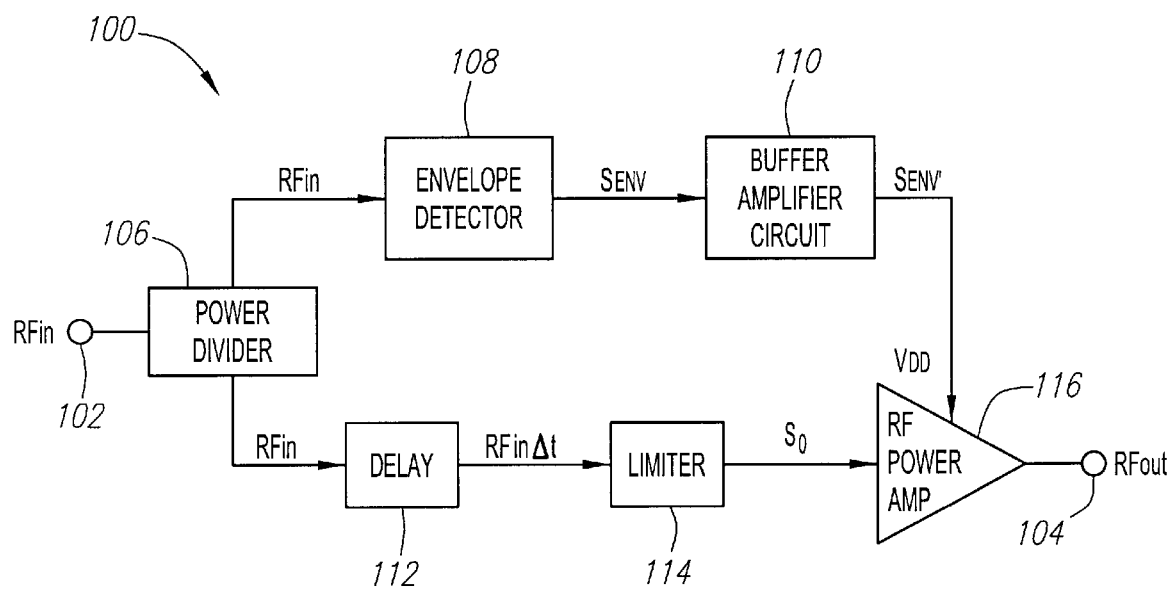
FIG. 1 is a schematic block diagram of an EER system constructed in accordance with present inventions.
Figure 2:
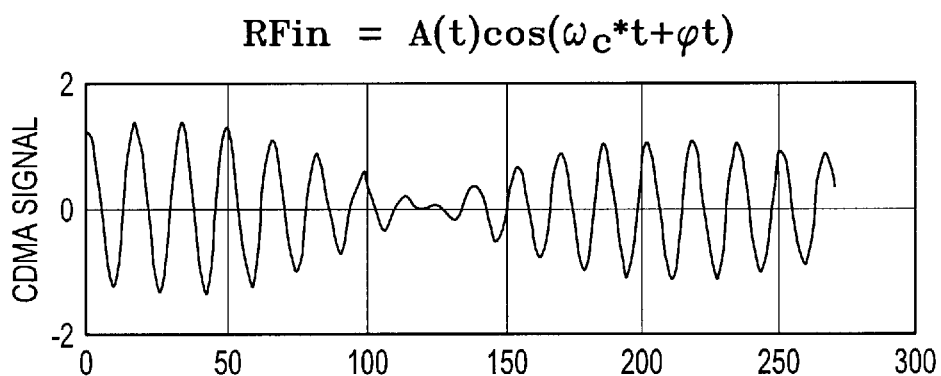
FIG. 2 is a plot of an exemplary CDMA signal input into the EER system of FIG. 1.

Referring to FIG. 1, an envelope elimination and restoration (EER) system 100, which is constructed in accordance with the present inventions, is generally shown. The EER system 100 comprises an RF input 102 into which a radio frequency (RF) signal $RF_{IN}$ is input, and an RF output 104 from which an amplified RF signal $RF_{OUT}$ is output. In the illustrated embodiment, the input signal $RF_{IN}$ is a code division multiple access (CDMA) signal, an exemplary waveform of which is depicted in FIG. 2. As can be seen, the input signal $RF_{IN}$ is modulated both in amplitude and phase, and can thus be represented by the equation: $RF_{IN}=A(t)\cos[\omega c*t+\phi t]$, where A is the amplitude modulation coefficient, $\omega c$ is the carrier frequency, t is time, and $\phi$ is the phase modulation coefficient. Without modification, amplification of the input signal $RF_{IN}$ would be relatively inefficient due to the relatively high peak-to-average amplitude ratio. The EER system 100, however, is configured to amplify the input signal $RF_{IN}$ in a more efficient manner. To this end, the EER system 100 generally comprises a power divider 106, envelope detector 108, buffer amplifier circuit 110, time delay element 112, limiter 114, and RF power amplifier 116.

Figure 3:
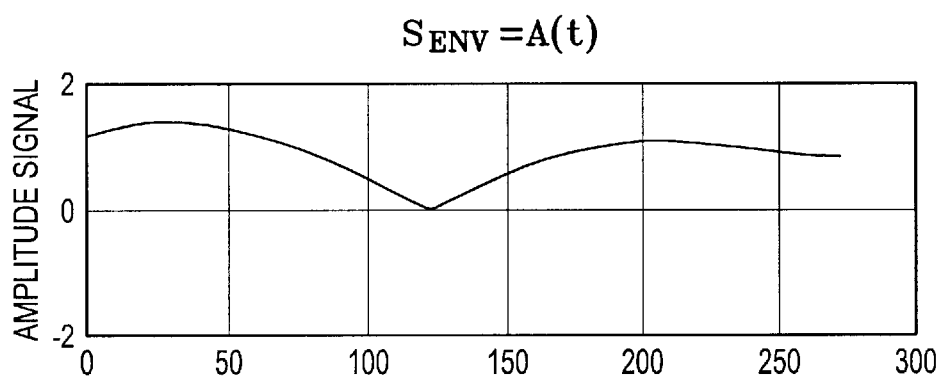
FIG. 3 is a plot of the envelope of the CDMA signal of FIG. 2.
Figure 4:
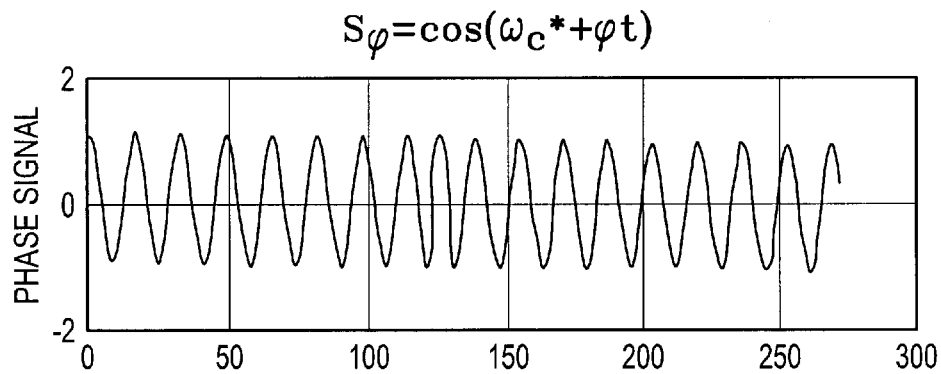
FIG. 4 is a plot of the phase modulated carrier of the CDMA signal of FIG. 2.

The power divider 106 splits the input signal $RF_{IN}$ into an amplitude path and a phase path. With regard to the amplitude path, the envelope detector 108 detects the envelope from the input signal $RF_{IN}'$, and generates an envelope signal $S_{ENV}$ in response thereto. The envelope signal $S_{ENV}$ represents the amplitude information of the input signal $RF_{IN}$. As can be seen from an exemplary waveform of the envelope signal $S_{ENV}$ depicted in FIG. 3, the relatively high frequency components of the input signal $RF_{IN}$ have been removed, leaving a relatively low frequency envelope signal $S_{ENV}$ equal to the time-varying amplitude modulation coefficient A(t). As will be discussed in further detail below, the envelope signal $S_{ENV}$ is efficiently amplified through the buffer amplifier circuit 110, generating an amplified envelope signal $S_{ENV}'$. Because the envelope signal $S_{ENV}$ has a relatively low frequency, the buffer amplifier circuit 110 is operated at a relatively low bandwidth, thereby improving its efficiency. With regard to the phase path, the time delay element 112 produces a delayed input signal $RF_{INA}$, with the delay selected to be equal to that introduced by the buffer amplifier circuit 110 in the amplitude path. Of course, if the delay introduced in the amplitude path is minimal or nonexistent, the time delay element 112 can be eliminated. The limiter 114 limits the amplitude of the delayed input signal $RF_{INA}$, generating a phase signal $S_\phi$, that represents the phase modulated carrier of the input signal $RF_{IN}$. As can be seen from an exemplary waveform of the phase signal $S_\phi$, depicted in FIG. 4, the amplitude variance of the input signal $R_{IN}$ has been removed, leaving a relatively high frequency signal with a uniform amplitude equal to the phase modulated carrier $\cos[\omega c*t+\phi t]$. The phase signal $S_\phi$, is amplified through the RF power amplifier 116, the efficiency of which is improved by the uniformity of the phase signal $S_\phi$ amplitude. To this end, the amplitude of the phase signal $S_\phi$, is preferably selected to maintain operation of the RF power amplifier 116 in saturation.

Figure 5:
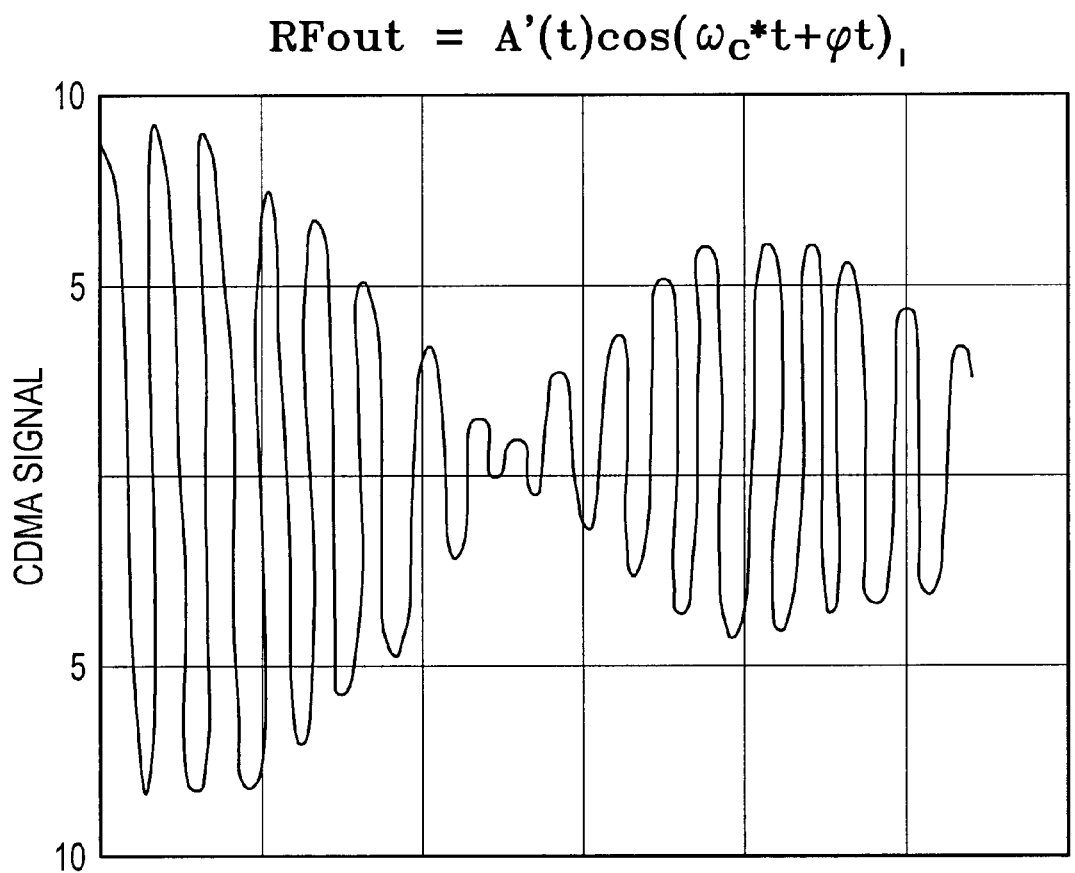
FIG. 5 is a plot of the amplified CDMA signal of FIG. 2.

The amplified phase signal $S_\phi$, is modulated with the amplified envelope signal $S_{ENV}$ to produce the amplified RF output signal $RF_{OUT}$. Specifically, the bias (in the case of JFET-based RF power amplifier, the drain bias) is varied in accordance with the amplified envelope signal $S_{ENV}$, which is applied to the DC power terminal of the RF power amplifier 116 as a time-varying DC supply voltage $V_{DD}$. Thus, the DC supply voltage $V_{DD}$ appears on the output of the RF power amplifier 116, which, in effect, modulates the phase signal $S_\phi$, with the supply voltage $V_{DD}$. The waveform of the output signal $RF_{OUT}$ is exemplified in FIG. 5. As can be seen, the output signal $RF_{OUT}$ is an amplified replica of the input signal $RF_{IN}$, and is represented by the equation $RF_{OUT}=A'(t)\cos[\omega c*t+\phi t]$, with A' being equal to the amplified amplitude modulation coefficient.

Because the efficiency and bandwidth performance of the EER system 100 is dependent on the efficiency and bandwidth performance of the buffer amplifier circuit 110 used in the amplitude path, the buffer amplifier circuit 1 10 is configured to efficiently and linearly amplify the envelope signal $S_{ENV}$ by amplifying the power residing in the relatively low frequency components of the envelope signal $S_{ENV}$ with a device exhibiting a relatively high power efficiency and narrow bandwidth performance, and amplifying the power residing in the relatively high frequency components of the envelope signal $S_{ENV}$ with a device exhibiting a relatively moderate power efficiency and wide bandwidth performance.

Figure 6:
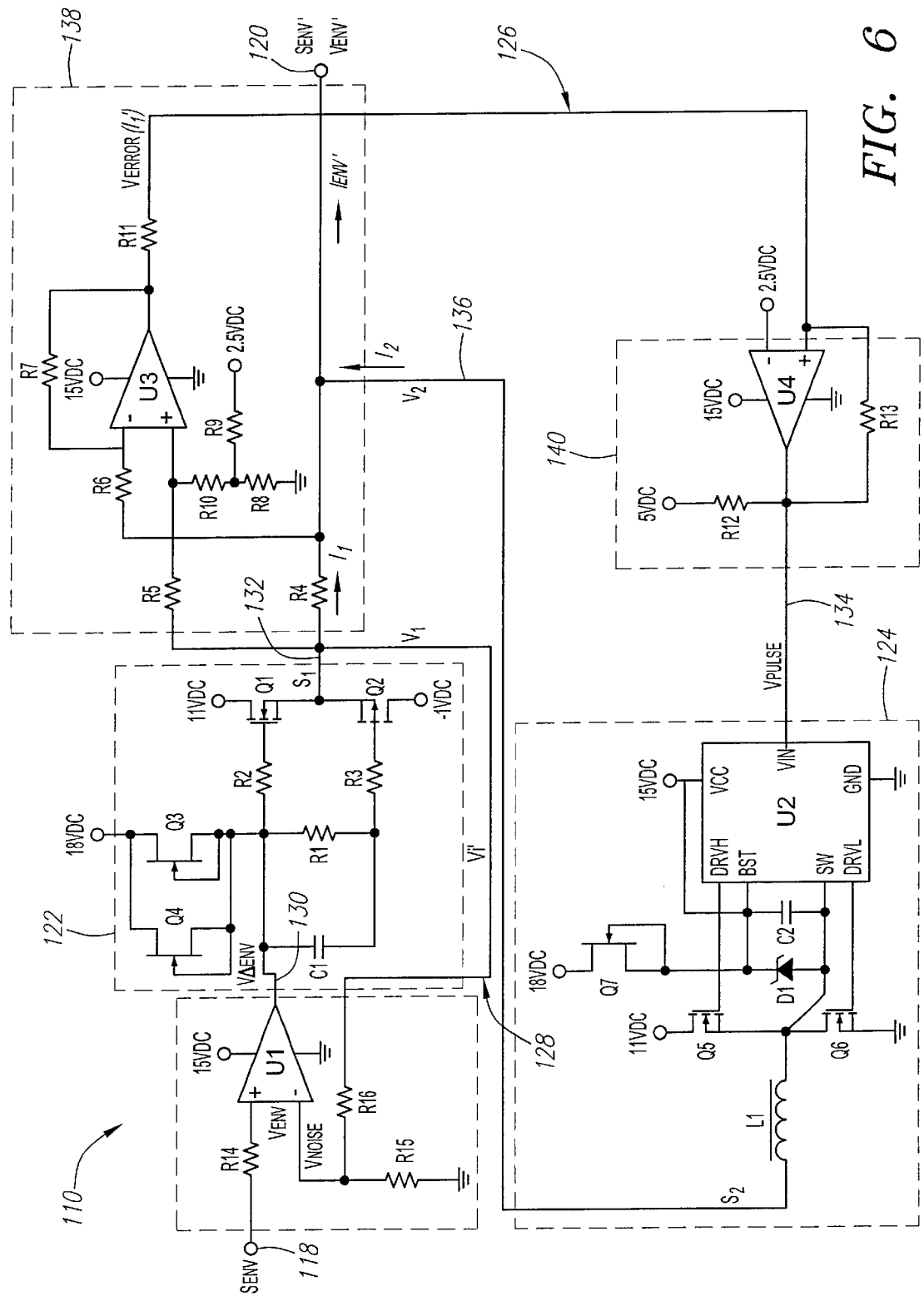
FIG. 6 is a schematic diagram of a buffer amplifier circuit employed within the EER system of FIG. 1.

To this end, and with reference to FIG. 6, the buffer amplifier circuit 110 is shown with an input 118 on which the envelope signal $S_{ENV}$ appears, and an output 120 on which the amplified envelope signal $S_{ENV}'$ appears. The amplifier circuit 110 generally includes an AB-type RF amplifier 122, which is a moderately power efficient device having high bandwidth capabilities, and a synchronous buck DC/DC converter 124, which is a highly efficient device having low bandwidth capabilities. With this said, the AB-type amplifier 122 is advantageously employed by the amplifier circuit 110 to amplify the power residing in the relatively high frequency components of the envelope signal $S_{ENV}$, thereby providing the amplifier circuit 110 with wide bandwidth capability. The DC/DC converter 124 is employed by the amplifier circuit 110 to amplify the power in the relatively low frequency components of the envelope signal $S_{ENV}$, providing the amplifier circuit 110 with increased power efficiency.

The amplifier circuit 110 further comprises a positive current feedback loop 126 coupled between an output 132 of the AB-type amplifier 122 and an input 134 of the DC/DC converter 124, as well as a negative voltage feedback loop 128 coupled between an output 136 of the DC/DC converter 124 and an input 130 of the AB-type amplifier 122. As will be described in further detail below, the current and voltage feedback loops 126 and 128 advantageously provide bilateral feedback between the AB-type amplifier 122 and DC/DC converter 124, thereby ensuring that the amplifier circuit 110 generates a substantially stable and distortion-free amplified envelope signal $S_{ENV}'$.

We now describe the structure of the amplifier circuit 110 in further detail. It is noted that for purposes of brevity in illustration, only the components and connections necessary to describe the functionalities of the amplifier circuit 110 are depicted in FIG. 6. The amplifier circuit 110 may, in fact, include more components and connections than those shown in FIG. 6.

The AB-type amplifier 122 can be characterized as a push-pull voltage follower. To this end, the AB-type amplifier 122 comprises upper and lower transistors Q1 and Q2, which in the illustrated embodiment, comprise N-channel and P-channel MOSFET's, respectively. The sources of the transistors Q1 and Q2 are coupled together to form the output 132 of the AB-type amplifier 122, with the drain of the upper transistor Q1 being coupled to a positive DC voltage source, e.g., 11V, and the drain of the lower transistor Q2 being coupled to a negative DC voltage source or ground, e.g., −1V. It is noted that the negative DC voltage allows the output 132 of the AB-type amplifier 122 to be pulled down to 0V if necessary, which would otherwise be difficult, if not impossible, to accomplish if the drain of the transistor Q2 were instead coupled to ground. Thus, the upper transistor Q1 provides the AB-type amplifier 122 with a voltage pull-up capability, and the lower transistor Q2 provides the AB-type amplifier 122 with a voltage pull-down capability.

The AB-type amplifier 122 further includes a biasing circuit coupled between a DC voltage source, e.g., 18V, and the gates of the transistors Q1 and Q2. Specifically, a current source, composed of parallel transistors Q3 and Q4 (in this case, JFET's), feeds current from the DC voltage source to the gates of transistors Q1 and Q2, with resistors R1, R2, and R3 providing selectable bias points for the transistors Q1 and Q2. By way of nonlimiting example, the values of resistors R1, R2, and R3 can be selected to be 2K $\Omega$, 10 $\Omega$, and 2 $\Omega$, respectively.

The input 118 of the amplifier circuit 110 is coupled to the input 130 of the AB-type amplifier 122 via a differential operational amplifier U1. For purposes that will be described in further detail below, the operational amplifier U1 determines the difference between an envelope voltage $V_{ENV}$ obtained from the envelope signal $S_{ENV}$ and a noisy voltage $V_{NOISE}$ obtained from the output 136 of the DC/DC converter 124, generating a difference envelope voltage $V_{\Delta ENV}$ at its output. The difference envelope voltage $V_{\Delta ENV}$ is applied to the gates of the transistors Q1 and Q2 via a capacitor C1 and the biasing circuit. In response to the difference envelope voltage $V_{\Delta ENV}$, the AB-type amplifier 122 generates a first signal $S_1$, which is represented by a voltage $V_1$ and a current $I_1$.

The first signal $S_1$. is an amplified version of the envelope signal $S_{ENV}$, and, taking the AB-type amplifier 122 by itself, would be an amplified replica of the envelope signal $S_{ENV}$ due to the wide bandwidth capability of the AB-type amplifier 122. As will be discussed in further detail below, however, the amplifier circuit 110 is configured, such that the AB-type amplifier 122 amplifies the power residing in the high frequency components of the envelope signal $S_1$, with little or no power in the low frequency components of the envelope signal $S_1$, being amplified by the AB-type amplifier 122.

The DC/DC converter 124 is generally composed of upper and lower switching transistors Q5 and Q6, an inductive element L1, and a control device U2. In the illustrated embodiment, the transistors Q5 and Q6 comprise JFET's, and the inductive element L1 has a suitable inductance value, e.g., 10 $\mu$H. In the illustrated embodiment, the control device U2 is embodied in an integrated circuit, which can be obtained from National Semiconductor located in Santa Clara, Calif. Of course, while an integrated device is preferable, any analog or digital circuit, discrete or integrated, or combinations thereof may be utilized if the functionalities of the invention may be achieved.

Under control of the control device U2, the transistors Q5 and Q6, which in the illustrated embodiment comprise N-channel JFET's, are switched opened and closed in a manner that alternately charges and discharges the inductive element L1. Specifically, the source and drain of the respective transistors Q5 and Q6 are coupled together, with the drain of the upper transistor Q5 being coupled to a DC voltage supply, e.g., 11V, and the source of the lower transistor Q6 being coupled to ground. The gates of the upper and lower transistors Q5 and Q6 are respectively coupled to the DRVH and DRVL pins of the control device U2. In this manner, the upper transistor Q5 can be alternately closed (i.e., it represents a virtual short circuit) and opened (i.e., it represents a virtual open circuit) by respectively transmitting high and low signals from the DRVH pin of the control device U2. Likewise, the lower transistor Q6 can be alternately closed and opened by respectively transmitting high and low signals from the DRVL pin of the control device U2.

To ensure that the switching transistors Q5 and Q6 are either substantially closed, or substantially open, i.e., an indefinite mode does not exist, the switching transistors Q5 and Q6 are suitably biased. Specifically, a current source, and in this case, a transistor Q7 (e.g., JFET), feeds the drains of the switching transistors Q5 and Q6 through a parallel combination of a capacitor C2 and Zener diode D1. The bias level can be adjusted by pins BST and SW of the control device U2.

The control device U2 effects the switching of the transistors Q1 and Q2 in accordance with a control voltage $V_{PULSE}$ input into pin VIN. That is, when the control voltage $V_{PULSE}$ is high, the control device U2 closes the upper transistor Q5 and opens the lower transistor Q6, thereby charging the inductive element L1. In contrast, when the control voltage $V_{PULSE}$ is low, the control device U2 opens the upper transistor Q5 and closes the lower transistor Q6, thereby discharging the inductive element L1. In response to the charging and discharging of the inductor L1, the DC/DC converter 124 generates a second signal $S_2$, which is represented by a voltage $V_2$ and a current $I_2$.

As will be described in further detail below, the control voltage $V_{PULSE}$ is derived from the first amplified signal $S_1$, which is in turn, derived from the envelope signal $S_{ENV}$. In this respect, the second signal $S_2$ is an amplified version of the envelope signal $S_{ENV}$. Due to the narrow bandwidth capability of the DC/DC converter 124, however, only the power residing in the low frequency components of the envelope signal $S_{ENV}$ are amplified through the DC/DC converter 124.

As will be described in further detail below, the first signal $S_1$ output from the AB-type amplifier 122 and the second signal $S_2$ output from the DC/DC converter 124 are superimposed at the output 120 of the amplifier circuit 110 to generate the amplified envelope signal $S_{ENV}'$, which is an amplified replica of the envelope signal $S_{ENV}$.

As briefly discussed above, the current feedback loop 126 is coupled between the output 132 of the AB-type amplifier 122 and the input of the DC/DC converter 124 to provide stability to the amplified envelope signal $S_{ENV}'$. To this end, the current feedback loop 126 generally includes a current sensor 138, which generates an error voltage $V_{ERROR}$ indicative of the first current $I_1$, flowing from the output 132 of the AB-type amplifier 122. The current feedback loop 126 further includes a pulse width modulator 140, which generates the control voltage $V_{PULSE}$ as a function of the error voltage $V_{ERROR}$ output from the current sensor 138.

Specifically, the current sensor 138 includes a resistor R4, which is coupled to the output 132 of the AB-type amplifier 122, and a differential operational amplifier U3, the noninverting and inverting inputs of which are coupled across the resistor R4. Thus, the first current $I_1$, flows across the resistor R4, which is, in turn, amplified through the operational amplifier U3 to the output thereof as the error voltage $V_{ERROR}$. The positive and negative terminals of the operational amplifier U3 are respectively coupled to a DC supply voltage, e.g., 15V, and to ground. Resistors R5, R6, and R7 are used to select the differential gain of the operational amplifier U3. By way of nonlimiting example, the resistance values of resistors R5, R6, and R7 can be 397 ohms, 397 ohms, and 10 ohms respectively, thereby providing the operational amplifier U3 with a differential gain of twenty-five. So that the error voltage $V_{ERROR}$ is maintained at a positive level, the output of the operational amplifier U3 is offset by resistors R8 and R9 and a DC voltage supply. By way of nonlimiting example, the resistance values of the resistors R8 and R9 can be 316 ohms and 953 ohms, with the value of the voltage supply being 2.5V, thereby providing the output of the operational amplifier U3 with a 2.5V offset. A resistor R10 is used to buffer the inverting input of the operational amplifier U3.

It should be noted that, to minimize the dissipation of power within the current feedback loop 126, the resistance value of resistor R4 is preferably as small as practically possible, e.g., 0.01 ohms. In this case, the operational amplifier U3 is configured to be relatively sensitive to the small voltage produced by the resistor R4, in which case the differential gain and offset of the operational amplifier U3 should be as precise as possible.

The pulse width modulator 140 comprises a comparator U4, which compares the voltage of the error voltage $V_{ERROR}$ to a threshold, outputting a high signal when the error voltage $V_{ERROR}$ is above the threshold, and outputting a low signal when the error voltage $V_{ERROR}$ is below the threshold. Specifically, the noninverting input of the comparator U4 is coupled to the output of the operational amplifier U3 through a buffer resistor R11, which has a suitable resistance value, e.g., 50 ohms. The inverting input of the comparator U4 is coupled to a DC reference voltage, e.g., 2.5V. The positive and negative terminals of the comparator U4 are respectively coupled to a DC supply voltage, e.g., 15V, and to ground.

Thus, when the error voltage $V_{ERROR}$ is greater than the reference voltage, the comparator U4 outputs a high voltage, and when the error voltage $V_{ERROR}$ is less than the reference voltage, the comparator U4 outputs a low voltage. The output of the comparator U4 is coupled to a DC voltage supply, e.g., 5V, to translate the level of the high output voltage to that of the DC voltage supply. Thus, if the DC voltage supply is 5V, the output of the comparator U4 will toggle between 0V and 5V.

To provide the comparator U4 with hysteresis, a resistor R12 is coupled between the supply voltage and the output of the comparator U4, and a resistor R13 is coupled between the output and noninverting input of the comparator U4. Thus, if the output of the comparator U4 is high, the error voltage $V_{ERROR}$ will have to be a predetermined value below the reference voltage for the output of the comparator U4 to transition from high to low. Likewise, if the output of the comparator U4 is low, the error voltage $V_{ERROR}$ will have to be a predetermined value above the reference voltage for the output of the comparator U4 to transition from low to high. This predetermined value is set by selecting the value of the resistors R12 and R13. By way of nonlimiting example, if the value of the resistors R12 and R13 are 1k ohms and 49.9 Kohms, respectively, the predetermined value will be 0.1V, assuming that the supply voltage is 5V.

Thus, the alternating high and low voltages output from the comparator U4 are input into the control device U2 of DC/DC converter 124 as the control voltage $V_{PULSE}$. As discussed above, the inductive element L1 is charged in response to the highs within the control voltage $V_{PULSE}$, thereby increasing the power in the second signal $S_2$, and discharged in response to the lows within the control voltage $V_{PULSE}$, thereby decreasing the power in the second signal $S_2$. In this manner, the second signal $S_2$ output from the DC/DC converter 125 discretely tracks the first current S1 output from the AB-type amplifier 122, thereby providing stability to the amplified envelope signal $S_{ENV}'$ generated on the output 120 of the amplifier circuit 110.

As briefly discussed above, a voltage feedback loop 128 is coupled between the output 136 of the DC/DC converter 124 and the input 118 of the AB-type amplifier 122 to prevent or mitigate the presence of noise of the amplified envelope signal $S_{ENV}'$ that may otherwise result from anomalies, e.g., voltage spikes output from the DC/DC converter 124. To this end, the voltage feedback loop 128 generally includes the previously described differential operational amplifier U1, which generates the difference envelope voltage $V_{\Delta ENV}$ in response to the envelope voltage $V_{ENV}$ derived from the envelope signal $S_{ENV}$, and the second voltage $V_2$ output from the DC/DC converter 124.

Specifically, the positive and negative terminals of the operational amplifier U1 are coupled to a DC supply voltage, e.g., 15V, and to ground. The noninverting input of the operational amplifier U1 is coupled to the input 118 of the amplifier circuit 110 for receiving the envelope voltage $V_{ENV}$, and the inverting input of the operational amplifier U1 is coupled to the output 136 of the DC/DC converter 124 for receiving the second voltage $V_2$. Resistors R14, R15, and R16 are used to select the differential gain of the operational amplifier U1. By way of nonlimiting example, the resistance values of resistors R14, R15, and R16 can be 511 ohms, 511 ohms, and 511 ohms, respectively, thereby providing the operational amplifier U1 with a differential gain of two. As discussed above, the difference envelope voltage $V_{\Delta ENV}$ output from the operational amplifier U1 is reflected in the second voltage $V_2$. As will be described in further detail below, any disturbances in the second voltage $V_2$ output from the DC/DC converter 124 are absorbed into the AB-type amplifier 122, rather than into any load connected to the output 120 of the amplifier circuit 110.

Figure 7:
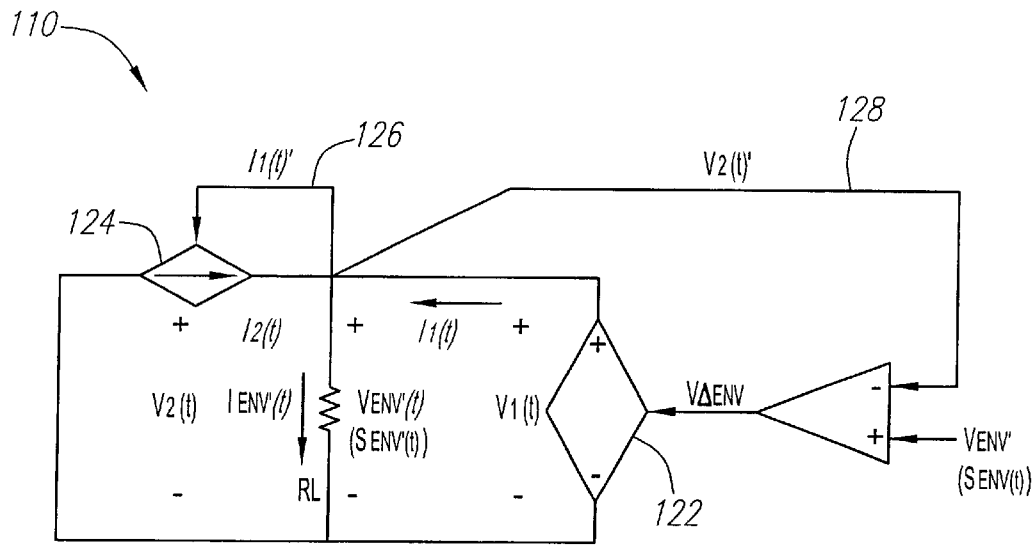
FIG. 7 is a functional block diagram of the buffer amplifier circuit of FIG. 5.

Operation of the amplifier circuit 110 in efficiently providing a substantially distortion-free amplified envelope signal $S_{ENV}'$ will now be described. The amplifier circuit 110 is topologically depicted in FIG. 7, with the FIG. 6 circuit designations being shown as like circuit designations that vary with time. Specifically, the AB-type amplifier 122 is represented by a dependent voltage source that outputs a first voltage $V_1(t)$ that directly varies in accordance with a difference envelope voltage $V_{\Delta ENV}(t)$, i.e., the difference between the envelope voltage $V_{ENV}(t)$ and a sensed second voltage $V_2'(t)$. The DC/DC converter 124 is represented by a dependent current source that outputs a second current $I_2(t)$ that directly varies in accordance with a sensed first current $I_1'(t)$. A load resistor $R_L$, which in the illustrated embodiment, represents the RF power amplifier 116 (shown in FIG. 1), is coupled between the voltage source $V_1(t)$ and the current source $I_1(t)$, with an amplified voltage $V_{ENV}'(t)$ and an amplified current $I_{ENV}'(t)$ appearing across the load resistor $R_L$.

Assuming that the voltage source $V_1(t)$ operates at a wide bandwidth commensurate with the bandwidth of the envelope signal $S_{ENV}(t)$, the voltage source $V_1(t)$, and thus the amplified voltage $V_{ENV}'(t)$ appearing across the load resistor $R_L$, is an amplified replica of the envelope voltage $V_{ENV}(t)$, i.e., it will have both low frequency and high frequency components. Thus, the amplified current $I_{ENV}'(t)$ flowing through the load resistor $R_L$ is an amplified replica of the envelope signal $S_{ENV}(t)$, and is therefore composed of both low frequency and high frequency components.

With this established as the premise, the sum of the first current $I_1(t)$ output from the voltage source and the second current $I_2(t)$ output from the current source is equal to the amplified current $I_{ENV}'(t)$. Assuming that the current source operates at a narrow bandwidth at the low frequency range of the envelope signal $S_{ENV}(t)$, the second current $I_2(t)$ output from the current source will be composed of low frequency components commensurate with the bandwidth of the current source. Thus, the first current $I_1(t)$ output from the voltage source will be necessarily composed of high frequency components, so that the sum of the first and second currents $I_1(t)$ and $I_2(t)$ are equal to the amplified current $I_{ENV}'(t)$. Thus, assuming that most of the power is contained within the low frequency components of the envelope signal $S_{ENV}(t)$ most of the power within the amplified signal $S_{ENV}'(t)$ will be produced by the power efficient current source.

Generally speaking, the second current $I_2(t)$ is an amplified replica of the low frequency components of the envelope signal $S_{ENV}$. It should be noted, however, that because the current source is inductance based, a time lag is introduced between the envelope current $I_{ENV}(t)$ and the second current $I_2(t)$. As a result, the first current $I_1(t)$ will necessarily contain a small portion of the low frequency components, the extent of which will depend upon the time variance of the envelope signal $S_{ENV}(t)$.

Because the first and second currents $I_1(t)$ and $I_2(t)$ are interdependent (by virtue of the current feedback loop 126 described above), stability is provided to the amplifier circuit 110. Specifically, the first current $I_1(t)$ directly tracks the second current $I_2(t)$, i.e., as the first current $I_1(t)$ increases and decreases, the second current $I_2(t)$ tends to respectively increase and decrease due to its direct dependency on the sensed current $I_2(t)$. The second current $I_2(t)$ inversely tracks the first current $I_1(t)$, i.e., as the first current $I_1(t)$ increases and decreases, the second current $I_2(t)$ tends to respectively decrease and increase due to its inverse dependency on the sensed first current $I_2(t)$. Accordingly, the first and second current $I_1(t)$ and $I_2(t)$ remain stable.

Because the first and second voltages $V_1(t)$ and $V_2(t)$ are interdependent (by virtue of the voltage feedback loop 128 described above), interference within the amplifier circuit 110 is minimized. Specifically, the first voltage $V_1(t)$ inversely tracks the second voltage $V_2(t)$, i.e., as the second voltage $V_2(t)$ increases and decreases, the first voltage $V_1(t)$ tends to respectively decrease and increase due to its inverse dependency on the sensed second voltage $V_2'(t)$. The second voltage $V_2(t)$ directly tracks the first voltage $V_1(t)$, i.e., as the first voltage $V_1(t)$ increases and decreases, the second voltage $V_2(t)$ tends to respectively increase and decrease due to parallel arrangement with the first voltage $V_1(t)$. Thus, if interference is introduced into the second voltage $V_2(t)$ by the current source 124, the first voltage V1 (t) compensates by canceling out the interference. In effect, the interference is absorbed by the voltage source 122, rather than by the resistive load $R_L$.

Figure 8:
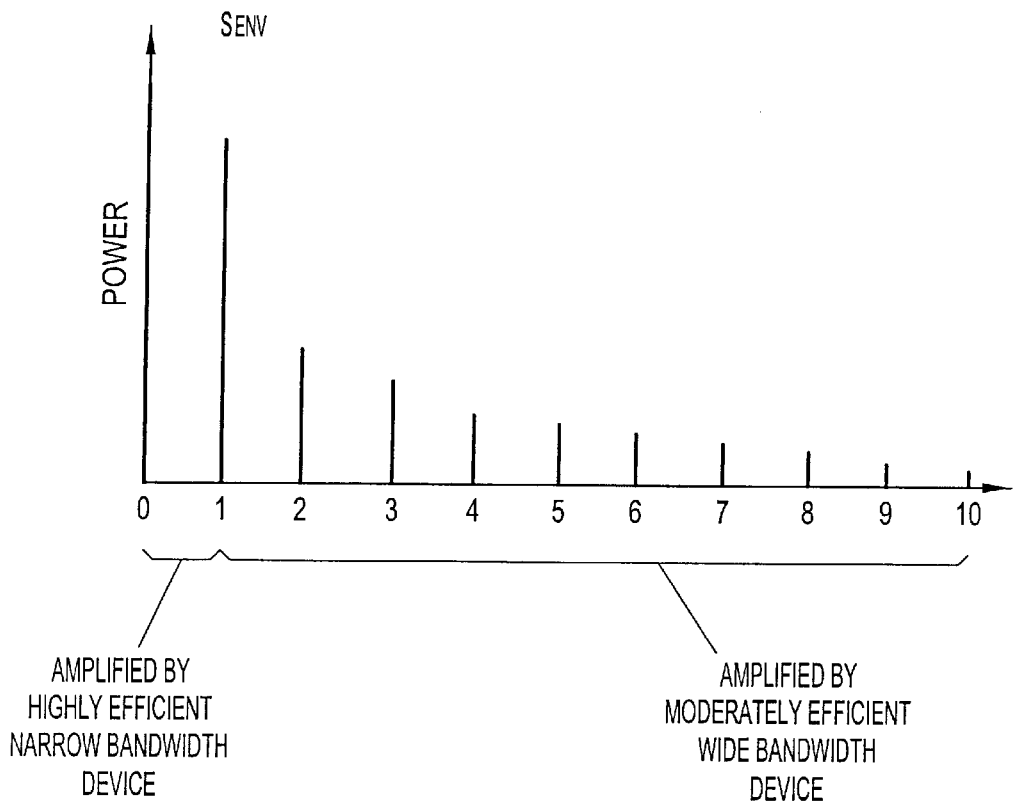
FIG. 8 is a spectral power plot of an exemplary envelope signal input into the buffer amplifier circuit of FIG. 5.

By way of nonlimiting example, the amplifier circuit 110 can be employed to efficiently amplify the exemplary envelope signal $S_{ENV}$ depicted in FIG. 8 without significant distortion. Specifically, the exemplary envelope signal $S_{ENV}$ exhibits a 10 MHz bandwidth ranging from 0 MHz to 10 MHz, with the majority of the power residing within the 0 MHz to 1 MHz range (around 95% for an envelope signal extracted from a CDMA signal). The amplifier circuit 110 takes advantage of this disparity in power by amplifying the relatively high power low frequency components of the exemplary envelope signal $S_{ENV}$ with the highly efficient DC/DC converter 124, and amplifying the relatively low power high frequency components of the exemplary envelope signal $S_{ENV}$ with the moderately efficient AB-type amplifier 122.

Thus, although the AB-type amplifier 122 exhibits a relatively moderate efficiency (typically, around 35%), the overall efficiency of the amplifier circuit 110 is not substantially affected, since a relatively low amount of power resides in the high frequency components of the exemplary envelope signal $S_{ENV}$. In contrast, since a relatively high amount of power resides in the low frequency components, the high efficiency of the DC/DC converter 124 (typically, around 90%) provides the amplifier circuit 110 with a significantly improved overall efficiency.

For example, assuming that the DC/DC converter 124 and AB-type amplifier 122 exhibit 90% and 35% efficiencies, respectively, and operate at a 3 dB bandwidth ranging from 0 MHz to 1 MHz, and from 1 MHz to 10 MHz, respectively, the overall efficiency of the amplifier circuit 110 would be approximately (0.95)(0.9)+(0.05)(0.35)=87.25%, when amplifying the exemplary envelope signal $S_{ENV}$ depicted in FIG. 8.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the scope of the appended claims.

What is claimed is:

1. A method of amplifying an input signal exhibiting one or more lower frequency components and one or more higher frequency components, the method comprising:
    generating a first signal by amplifying the power residing in the one or more higher frequency components and the one or more lower frequency components of the input signal;
    sensing the first signal;
    generating a second signal by amplifying the power residing in the one or more lower frequency components of the sensed first signal;
    inversely varying the one or more lower frequency components of the first signal with the second signal; and
    combining the first and second signals to produce the amplified input signal.

2. The method of claim 1, wherein a current of the first signal is sensed.

3. The method of claim 1, further comprising:
    sensing the second signal;
    and inversely varying the second signal with the sensed first signal.

4. The method of claim 3, wherein a voltage of the second signal is sensed.

5. The method of claim 1, wherein the amplification of the first signal comprises a first power efficiency, and the amplification of the second signal comprises a second power efficiency greater than the first power efficiency.

6. The method of claim 1, wherein the input signal comprises a nominal bandwidth ranging from 0 MHz to 10 MHz.

7. The method of claim 6, wherein the low frequency components range from 0 MHz to 1 MHz, and the high frequency components range from 1 MHz to 10 MHz.

8. The method of claim 1, wherein the input signal exhibits a plurality of low frequency components, and a plurality of high frequency components.

9. The method of claim 1, wherein the input signal comprises an envelope signal.

10. The method of claim 1, wherein the input signal comprises an envelope signal obtained from a CDMA signal.

11. An amplifier circuit for amplifying an input signal, comprising:
    an AB-type RF amplifier having an input and an output, the input configured to receive the RF input signal;
    a synchronous buck DC/DC converter having an input and an output,
    a positive feedback loop coupled between the output of the amplifier and the input of the converter; and
    a resistive load coupled in parallel between the respective outputs of the amplifier and converter.

12. The amplifier circuit of claim 11, wherein the feedback loop comprises a current sensor having an input and an output, and a pulse width modulator having an input and an output, wherein the input of the current sensor is coupled to the output of the AB-type amplifier, the output of the current sensor is coupled to the input of the pulse width modulator, and the output of the pulse width modulator is coupled to the input of the DC/DC converter.

13. The amplifier circuit of claim 11, further comprising a negative feedback loop coupled between the output of the DC/DC converter and the input of the AB-type amplifier.

14. The amplifier circuit of claim 11, wherein the feedback loop comprises a differential operational amplifier having an output coupled to the input of the RF amplifier, an inverting input coupled to the output of the DC/DC converter, and a noninverting input configured for receiving the RF input signal.

15. The amplifier circuit of claim 11, wherein the RF input signal is an envelope signal.

16. The amplifier circuit of claim 11, wherein the RF input signal is an envelope signal obtained from a CDMA signal.

17. An amplifier circuit for amplifying an input signal, comprising:
    a dependent voltage source that operates at a first bandwidth and a first power efficiency, the voltage source configured for generating a first voltage that varies with the input signal, and a first current;
    a current source that operates at a second bandwidth narrower than the first bandwidth, and a second power efficiency greater than the first power efficiency, the current source configured for generating a second current that varies with the first current, and a second voltage; and
    a load coupled in parallel between the voltage source and current source, wherein the first voltage appears across the load, and the first and second currents flow through the load.

18. The amplifier circuit of claim 17, wherein the current source includes an inductive element.

19. The amplifier circuit of claim 17, wherein the first voltage inversely varies with the second voltage.

20. The amplifier circuit of claim 17, wherein the first bandwidth ranges from 0 MHz to 10 MHz, and the second bandwidth ranges from 0 MHz to less than 1 MHz.

21. The amplifier circuit of claim 17, wherein the RF input signal is an envelope signal.

22. The amplifier circuit of claim 17, wherein the RF input signal is an envelope signal obtained from a CDMA signal.

23. The amplifier circuit of claim 17, wherein the voltage source is an AB-type amplifier.

24. The amplifier circuit of claim 17, wherein the current source is a synchronous buck DC/DC converter.

* * * * *

UNITED STATES PATENT AND TRADEMARK OFFICE
CERTIFICATE OF CORRECTION

PATENT NO.    : 6,300,826 B1
DATED         : October 9, 2001
INVENTOR(S)   : Lennart Mathe et al.

It is certified that error appears in the above-identified patent and that said Letters Patent is hereby corrected as shown below:

<u>Title page,</u>
Item [73], assignee: should read -- Telefonaktiebolaget LM Ericsson --

Signed and Sealed this

Eighteenth Day of June, 2002

*Attest:*

*Attesting Officer*

JAMES E. ROGAN
*Director of the United States Patent and Trademark Office*